(12) United States Patent
Lin et al.

(10) Patent No.: US 8,494,207 B2
(45) Date of Patent: Jul. 23, 2013

(54) COMPACT HOUSING FOR PORTABLE ELECTRONIC DEVICE WITH INTERNAL SPEAKER

(75) Inventors: Gloria Lin, San Ramon, CA (US); Derek B. Barrentine, San Jose, CA (US); Michael Rosenblatt, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/571,177

(22) Filed: Aug. 9, 2012

(65) Prior Publication Data

US 2012/0298441 A1    Nov. 29, 2012

Related U.S. Application Data

(62) Division of application No. 12/240,519, filed on Sep. 29, 2008, now Pat. No. 8,265,329.

(60) Provisional application No. 61/094,816, filed on Sep. 5, 2008.

(51) Int. Cl.
*H04R 1/02* (2006.01)

(52) U.S. Cl.
USPC ............ 381/386; 381/332; 381/396; 361/818

(58) Field of Classification Search
USPC ................. 381/386, 388, 396, 332; 361/800, 361/816; 174/350
See application file for complete search history.

(56) References Cited

U.S. PATENT DOCUMENTS

| | | | |
|---|---|---|---|
| 4,838,475 A * | 6/1989 | Mullins et al. ............. | 228/179.1 |
| 4,969,197 A | 11/1990 | Takaya | |
| 5,736,808 A | 4/1998 | Szilagyi et al. | |
| 5,796,854 A | 8/1998 | Markow | |
| 5,907,625 A | 5/1999 | Kanani et al. | |
| 5,953,414 A * | 9/1999 | Abraham et al. ......... | 379/433.02 |
| 6,026,283 A * | 2/2000 | Stephenson ................ | 455/575.1 |
| 6,501,016 B1 | 12/2002 | Sosnowski | |
| 6,670,017 B2 * | 12/2003 | Huang et al. ................. | 428/66.4 |
| 6,940,010 B2 | 9/2005 | Cunningham et al. | |
| 7,088,838 B2 | 8/2006 | Rye et al. | |
| 7,109,817 B2 | 9/2006 | Kolb et al. | |
| 7,129,422 B2 | 10/2006 | Arnold | |
| 7,233,678 B2 * | 6/2007 | Erixon et al. ................. | 381/345 |

(Continued)

FOREIGN PATENT DOCUMENTS

| | | |
|---|---|---|
| JP | 04107597 | 4/1992 |
| JP | 06-036153 | 5/1994 |

OTHER PUBLICATIONS

Office Action for U.S. Appl. No. 12/240,519, mailed Sep. 12, 2011.

(Continued)

*Primary Examiner* — Michael Trinh
(74) *Attorney, Agent, or Firm* — Dorsey & Whitney LLP

(57) ABSTRACT

Improved approaches for providing a speaker within a housing of a portable electronic device are disclosed. The housing of the portable electronic device can be compact, such as a low profile housing. In one embodiment, an acoustic chamber for a speaker can be formed internal to a housing for a portable electronic device using non-dedicated space. In another embodiment, irregular surfaces can be sealed so that an acoustic chamber for a speaker can be formed internal to a housing for a portable electronic device.

9 Claims, 4 Drawing Sheets

U.S. PATENT DOCUMENTS

| | | |
|---|---|---|
| 7,259,969 B2 | 8/2007 | Zarganis et al. |
| 7,769,457 B2 | 8/2010 | Fonte |
| 8,031,864 B2 | 10/2011 | Rosenblatt |
| 8,126,170 B2 | 2/2012 | Yeates et al. |
| 2001/0032193 A1 | 10/2001 | Ferber et al. |
| 2001/0033478 A1 | 10/2001 | Ortiz et al. |
| 2002/0009905 A1 | 1/2002 | Poplawski et al. |
| 2004/0088218 A1 | 5/2004 | Abraham et al. |
| 2006/0272857 A1 | 12/2006 | Arnold |
| 2007/0013042 A1 | 1/2007 | Henell et al. |
| 2007/0121967 A1 | 5/2007 | Sjursen et al. |
| 2007/0211444 A1* | 9/2007 | Hamilton et al. ............. 361/796 |
| 2008/0037238 A1 | 2/2008 | Kimata et al. |
| 2008/0080160 A1 | 4/2008 | English et al. |
| 2008/0085021 A1 | 4/2008 | Shim |
| 2008/0103655 A1 | 5/2008 | Turnbull et al. |
| 2008/0162280 A1 | 7/2008 | Jacobs et al. |
| 2008/0281691 A1 | 11/2008 | Pearson et al. |
| 2008/0315376 A1 | 12/2008 | Tang et al. |
| 2009/0259538 A1 | 10/2009 | Miller et al. |
| 2010/0061577 A1 | 3/2010 | Yeates et al. |
| 2010/0061584 A1 | 3/2010 | Lin |
| 2010/0070361 A1 | 3/2010 | Hurley et al. |
| 2010/0246143 A1 | 9/2010 | Dinh et al. |

OTHER PUBLICATIONS

Office Action for U.S. Appl. No. 12/240,519, mailed Jan. 6, 2012.
Notice of Allowance for U.S. Appl. No. 12/240,519, mailed May 23, 2012.

* cited by examiner

COMPACT HOUSING FOR PORTABLE ELECTRONIC DEVICE WITH INTERNAL SPEAKER

CROSS-REFERENCE TO OTHER APPLICATION

This application is a divisional application of U.S. Pat. No. 8,265,329, filed Sep. 29, 2008, entitled "COMPACT HOUSING FOR PORTABLE ELECTRONIC DEVICE WITH INTERNAL SPEAKER", which is hereby incorporated herein by reference, and which in turn claims priority to U.S. Provisional Patent Application No. 61/094,816, filed Sep. 5, 2008, entitled "COMPACT HOUSING FOR PORTABLE ELECTRONIC DEVICE WITH INTERNAL SPEAKER", which is hereby incorporated herein by reference.

This application also references U.S. Provisional Patent Application No. 61/094,811, filed Sep. 5, 2008, entitled "ELECTROMAGNETIC INTERFERENCE SHIELDS WITH PIEZOS", which is hereby incorporated herein by reference.

BACKGROUND OF THE INVENTION

Conventionally, a dedicated area within an electronic device housing is used to provide a chamber for a speaker. The speaker is utilized by the electronic device to produce audio sound for the benefit of the user of the electronic device. For example, the speaker can produce audio sounds corresponding to music, movies or speech. Unfortunately, however, as electronic devices become increasingly more compact, the availability of space within a housing for a compact electronic device becomes more limited. Accordingly, given the constrained geometries and tight tolerances of compact portable electronic devices, such as handheld portable electronic devices, it is increasingly difficult to provide a speaker with a desired acoustic chamber.

Piezoelectric speakers are often used in compact portable electronic devices, such as portable media players and mobile telephones, because of their low profile and relatively small footprint. Piezoelectric speakers create sound by forming vibrations with a diaphragm via a piezoelectric driver. In general, the sound quality associated with piezoelectric speakers is adequate, but is often not to the level that may be desired in particular applications. The sound quality associated with piezoelectric speakers may be worsened by the actual placement of the piezoelectric speakers within electronic devices. That is, the location at which a piezoelectric speaker is placed may not be a location which is not substantially optimal for the performance of the piezoelectric speaker. Piezoelectric speakers are often placed wherever they fit within electronic devices, without regard for whether the placement of the piezoelectric speakers provides substantially the best sound quality that may be achieved by the piezoelectric speakers.

Thus, there is a need for improved techniques for forming an acoustic chamber for a speaker, such as a piezoelectric speaker, within an electronic device housing.

SUMMARY

The invention pertains to improved approaches for providing a speaker within a housing of a portable electronic device. The housing of the portable electronic device can be compact, such as a low profile housing. The portable electronic device can pertain to a portable digital media player, a mobile telephone, personal digital assistant, etc.

According to one aspect of certain embodiments of the invention, an acoustic chamber (e.g., back volume) for a speaker can be formed internal to a housing for a portable electronic device using non-dedicated space. According to another aspect of certain embodiments of the invention, irregular surfaces can be sealed so that an acoustic chamber for a speaker can be formed internal to a housing for a portable electronic device. Advantageously, an acoustic chamber for a speaker can be expanded and flexibly formed even within a low profile housing. In one embodiment, the speaker can be a piezoelectric loudspeaker.

The invention may be implemented in numerous ways, including, but not limited to, as a system, device, apparatus, or method. Example embodiments of the present invention are discussed below.

As a portable electronic device, one embodiment of the invention can, for example, include at least: a housing; a speaker provided in the housing; a back volume for the speaker; and a front volume for the speaker. The back volume is formed from an area within the housing that is not dedicated to the back volume, and the front volume is formed from an area within the housing that is not dedicated to the front volume.

As a portable electronic device, another embodiment of the invention can, for example, include at least: a printed circuit board; electrical components mounted on the printed circuit board; a EMI shielding structure attached to the printed circuit board and provided over one of more of the electrical components; a speaker attached to the EMI shielding structure; and a form-in-place seal used to at least in part form an acoustic chamber for the speaker.

As a method for assembling a portable electronic device having an internal acoustic back volume, one embodiment of the invention can, for example, include at least: obtaining a printed circuit board; attaching electrical components to the printed circuit board; attaching an EMI shielding can to the printed circuit board such that the EMI shielding can is placed over one or more of the attached electrical components; attaching a speaker to the EMI shielding can; applying a form-in-place sealant to one or more particular locations of the assembled printed circuit board; curing the form-in-place sealant; and thereafter assembling the portable electronic device such that the assembled printed circuit board is provided within a housing of the portable electronic device and such that the internal acoustic back volume is formed within the portable electronic device housing and coupled to the speaker.

As a portable electronic device, still another embodiment of the invention can, for example, include at least: a housing; electrical components provided within the housing; an internal structure provided within the housing; a speaker provided within the housing and attached to the internal structure; and a form-in-place seal provided within the housing, the form-in-place seal being used to at least in part form an acoustic chamber for the speaker.

Various aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF EMBODIMENTS OF THE INVENTION

The invention pertains to improved approaches for providing a speaker within a housing of a portable electronic device. The housing of the portable electronic device can be compact, such as a low profile housing. The portable electronic device can pertain to a portable digital media player, a mobile telephone, personal digital assistant, etc.

According to one aspect of certain embodiments of the invention, an acoustic chamber (e.g., back volume) for a speaker can be formed internal to a housing for a portable electronic device using non-dedicated space. According to another aspect of certain embodiments of the invention, irregular surfaces can be sealed so that an acoustic chamber for a speaker can be formed internal to a housing for a portable electronic device. Advantageously, an acoustic chamber for a speaker can be expanded and flexibly formed even within a low profile housing. In one embodiment, the speaker can be a piezoelectric loudspeaker.

Embodiments of the invention are discussed below with reference to FIGS. 1-6. However, those skilled in the art will readily appreciate that the detailed description given herein with respect to these figures is for explanatory purposes as the invention extends beyond these limited embodiments.

Figure 1:
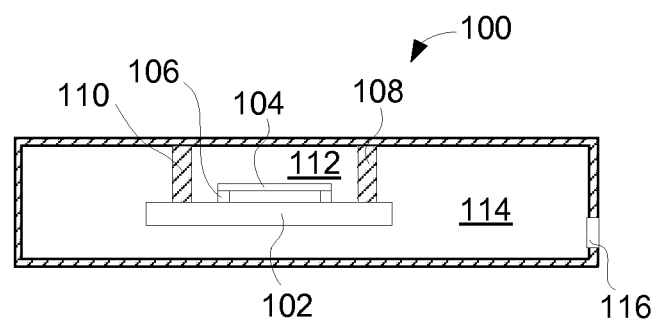
FIG. 1 is a simplified sectional side view of a portable electronic device housing according to one embodiment of the invention.

FIG. 1 is a simplified sectional side view of a portable electronic device housing 100 according to one embodiment of the invention. The portable electronic device housing 100 is a housing for a portable electronic device. The portable electronic device housing 100 can be of any material or combination of materials, such as metals, plastics, or ceramics. Typically, the portable electronic device (and thus the housing 100) is compact and highly portable, such as a handheld electronic device.

The portable electronic device housing 100 includes an internal structure 102 having a speaker 104 couples thereto. The internal structure 102 can represent any suitable structure within the portable electronic device housing 100. For example, the internal structure 102 can pertain to a printed circuit board. As another example, the internal structure 102 can pertain to an Electrical Magnetic Interference (EMI) shielding can (also known as a RF can). In one embodiment, the speaker 104 can be a disc type speaker, such as a piezo-electric speaker. The speaker 104 can be secured with respect to the internal structure 102 by an adhesive seal 106. The seal 106 can be provided around the periphery of the speaker 104 with respect to a front side of the speaker 104 that is secured to the internal structure 102. In one embodiment, the adhesive seal 106 can be implemented by double-sided adhesive tape (e.g., VHB™ tape).

In addition, a first gasket 108 and a second gasket 110 can combine to form a back volume 112 adjacent a back side of the speaker 104. The first gasket 108 and the second gasket 110 can create a seal above the back side of the speaker 104 and between the internal structure 102 and an inner surface of the housing 100. The first gasket 108 and the second gasket 110 can rubber or other material that tends to be somewhat compliant. A front volume 114 for the speaker 104 can also be formed within the portable electronic device housing 100. The back volume 112 and the front volume 114 are isolated (or nearly isolated) volumes of air that reside within an internal area of the portable electronic device housing 100.

The portable electronic device housing 100 also includes an opening 116. The opening 116 is adjacent the front volume 114 for the speaker 104. The opening 116 can be a dedicated opening for the speaker 104 or can alternatively be an opening provided for another purpose. In this embodiment, the internal structure 102 will include at least one opening so that the front side of the speaker 104 can couple to the front volume 114. Here, the sound waves produced by the speaker 104 can transmit through the front volume 114 and out of the opening 116 so that the resulting audio sound can be heard by a user (or bystander) associated with the portable electronic device.

As illustrated in FIG. 1, the back volume 112 is substantially sealed against the inner surface of the portable electronic device housing 100. However, since the back volume 112 includes essentially the volume of air above the back surface of the speaker 104, the back volume 112 is rather limited, particularly with portable electronic device housings that are compact, such as for handheld electronic devices. Since improved fidelity might be achieved by a larger back volume, different sealing configurations, arrangements or approaches can be used to obtain different back volumes.

Figure 2:
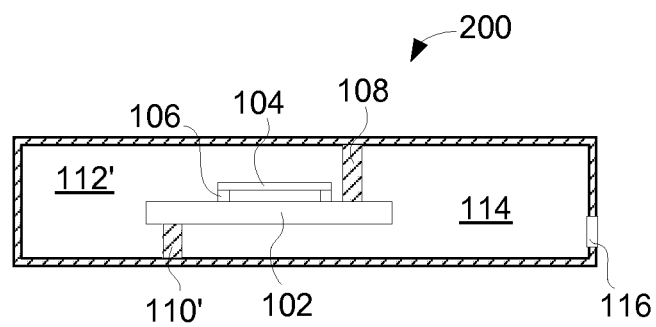
FIG. 2 is a simplified sectional side view of a portable electronic device housing according to another embodiment of the invention.

FIG. 2 is a simplified sectional side view of a portable electronic device housing 200 according to another embodiment of the invention. The portable electronic device housing 200 is generally similar to the portable electronic device housing 100 illustrated in FIG. 1. However, the second gasket 110' is positioned away from the speaker 104 so that the back volume 112' is increased as compared to the back volume 112 in FIG. 1. While the first gasket 108 seals upward from the internal structure 102 to an upper, inner surface of the portable electronic device housing 200, the second gasket 110' seals downward from the internal structure 102 to a lower, inner surface of the portable electronic device housing 200.

Figure 3:
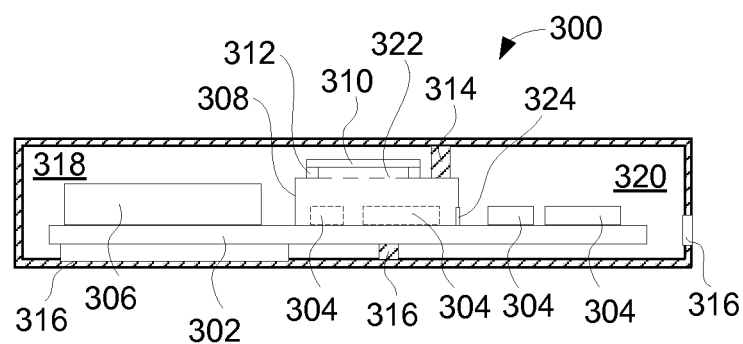
FIG. 3 is a simplified sectional side view of a portable electronic device housing according to one embodiment of the invention.

FIG. 3 is a simplified sectional side view of a portable electronic device housing 300 according to one embodiment of the invention. The portable electronic device housing 300 can represent a more detailed embodiment for the portable electronic device housing 200 illustrated in FIG. 2.

The portable electronic device housing 300 encloses a printed circuit board 302. Various electrical components 304 are attached to the printed circuit board 302. The electrical components 304 can pertain to integrated circuits, analog devices (e.g., resistor, capacitor, transistor), etc. that are often utilized by portable electronic devices. A battery 306 and a display 307, which can be considered relatively large electrical components, can also be attached to the printed circuit board 302.

In addition, the portable electronic device housing 300 can include an Electrical Magnetic Interference (EMI) shielding can 308. The EMI shielding can 308 can also be referred to as an RF can. The EMI shielding can 308 can be mounted on the printed circuit board 302. Typically, the EMI shielding can 308 covers or encloses one or more of the electrical components 304 so as to reduce EMI emissions. A speaker 310 can be coupled to an upper surface of the EMI shielding can 308. In one embodiment, the speaker 310 can be a disc type speaker, such as a piezoelectric speaker. The speaker 310 can be secured with respect to the EMI shielding can 308 by an adhesive seal 312. The adhesive seal 106 can be provided around the periphery of the speaker 310 with respect to a front side of the speaker 310 that is secured to the EMI shielding can 308. In one embodiment, the adhesive seal 106 can be double-sided adhesive tape.

In addition, a first seal 314 and a second seal 316 can combine to form a back volume 318 behind a back side of the speaker 310. The first seal 314 and the second seal 316 can create a seal between the back volume 318 of the speaker 310 and a front volume 320 of the speaker 310. The EMI shielding can 308 can include one or more openings 322 (e.g., holes) in its upper surface adjacent the speaker 310. The opening 320 enables sound waves induced by the speaker 310 to propagate into the EMI shielding can 308. The EMI shielding can 308 also include at least one opening 324 that allows the sound waves from the speaker 310 to exit the EMI shielding can 308. The opening 324 is an opening of or into the front volume 320. The portable electronic device housing 300 also includes an opening 326. The opening 326 is coupled to the front volume 320 for the speaker 310 so that sound waves generated by the speaker 310 can exit the portable electronic device housing 300. The opening 326 can be a dedicated opening for the speaker 310 or can alternatively be an opening provided for another purpose (e.g., connector opening).

Both the back volume 318 and the front volume 320 are formed internal to the portable electronic device housing 310, though the internal components and seals are used to substantially isolate the front volume 320 from the back volume 318. For example, as illustrated in FIG. 3, at a minimum to isolate the front volume 320 from the back volume 318, the first seal 314 and the second seal 316 cooperate with portions of the EMI shielding can 308 and the printed circuit board 302.

Figure 4A:
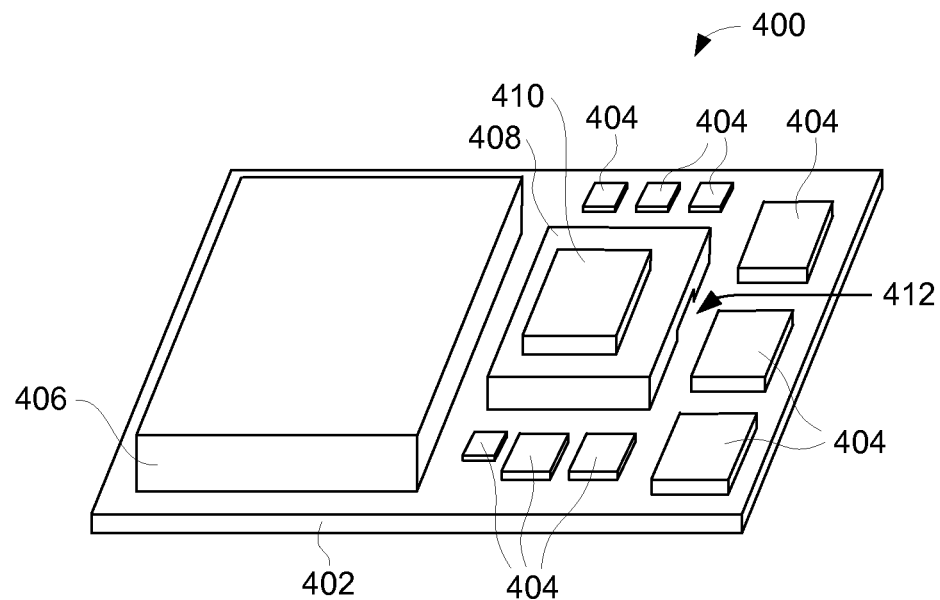
FIG. 4A is an upper perspective view of a board assembly according to one embodiment of the invention.

FIG. 4A is an upper perspective view of a board assembly 400 according to one embodiment of the invention. The board assembly 400 has a printed circuit board 402 as a base. Electrical components 404 are attached to the printed circuit board 202 and are electrically interconnected via metal traces provided on the printed circuit board. The electrical components 404 can pertain to integrated circuits, analog devices (e.g., resistor, capacitor, transistor), etc. that are often utilized by portable electronic devices. A battery 406 can also be attached or placed proximate to the printed circuit board 402. Still further, an Electro-Magnetic Interference (EMI) can 408 can be attached to the printed circuit board 402. A speaker 410 can be coupled proximate to a top surface of the EMI can 408. An intermediate layer (not shown) can be provided between the top surface of the EMI can 408 and the speaker 410. For example, the intermediate layer can pertain to a layer of adhesive provided around the periphery of the speaker 410 so as to secure and seal the front side of the speaker 410 to the top surface of the EMI can 408. In one embodiment, the intermediate layer can be double-sided adhesive tape.

The EMI can 410 can include one or more openings in a top surface (not shown, see FIG. 3) that enable sound waves produced by the speaker 410 to enter the EMI can 408. The EMI can 408 is also substantially sealed with respect to the printed circuit board 402 with the exception of an opening 412 in one side of the EMI can 408.

Figure 4B:
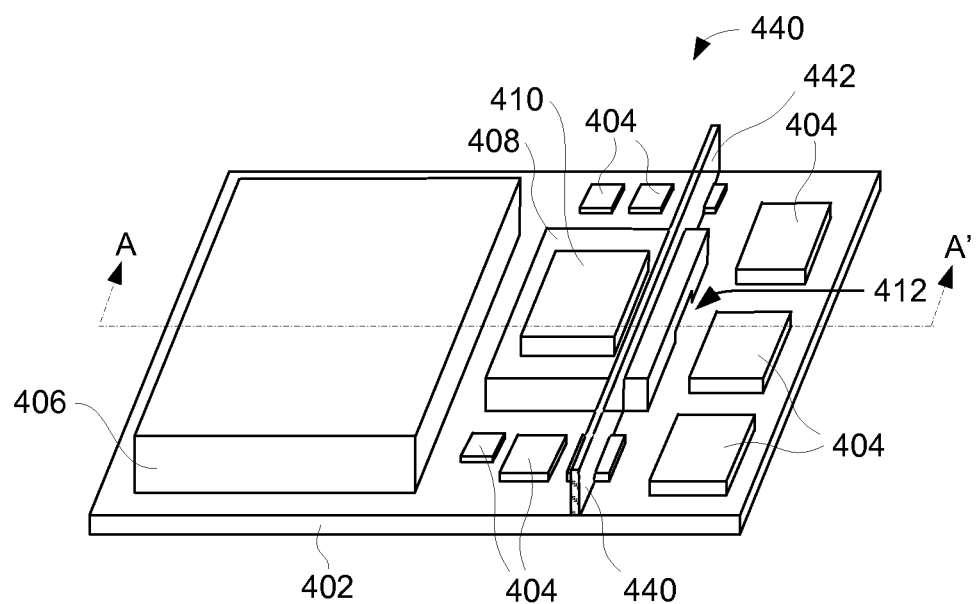
FIG. 4B is an upper perspective view of a board assembly according to another embodiment of the invention.

FIG. 4B is an upper perspective view of a board assembly 400 according to another embodiment of the invention. The board assembly 440 is generally similar to the board assembly 400 illustrated in FIG. 4A. However, the board assembly 440 further includes a barrier 442. When the board assembly 440 is provided with a portable electronic device housing, the barrier 442 operates to seal with respect to one or more inner sides of the portable electronic device housing. Consequently, the barrier 442 provides a demarcation between a front volume and a back volume for the speaker 410. Interestingly, the barrier 442 can be provided over irregular surfaces, yet still provide a reliable seal. For example, as shown in FIG. 4B, the barrier 442 has it lower surface sealed against a portion of the printed circuit board 402, the EMI shielding can 408 and the electrical components 404. The formation of the barrier 442 is such that the lower surface of the barrier 442 is able to be formed over the different heights. In one embodiment, as discussed in greater detail below, the barrier 442 can be formed from a liquid or gel that can easily conform to irregular surfaces, and can then cure to a said form. The resulting barrier 442 not only seals against the irregular surfaces but also typically remains compliant so that it can be compressed against when forming a seal. In one implementation, the barrier 442 can be formed from a form-in-place material.

Figure 4C:
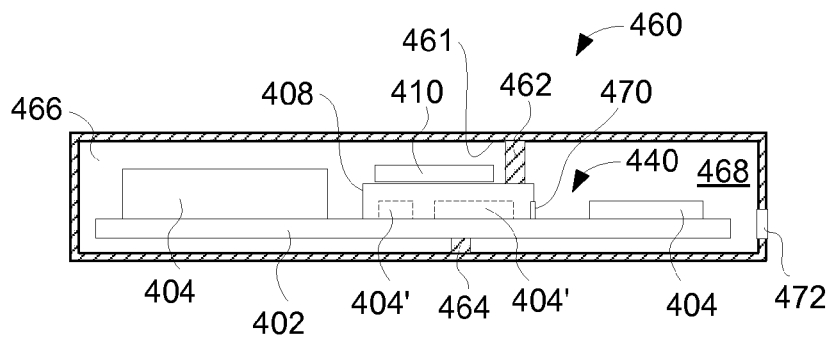
FIG. 4C is a simplified sectional side view of a portable electronic device housing according to one embodiment of the invention.

FIG. 4C is a simplified sectional side view of a portable electronic device housing 460 according to one embodiment of the invention. The portable electronic device housing 460 represents a housing for a portable electronic device that encloses the board assembly 440 illustrated in FIG. 4B. The sectional side view of the portable electronic device housing 460 illustrates a sectional view along reference line A-A' illustrated in FIG. 4B.

The portable electronic device housing 460 represents a housing for a portable electronic device that contains the board assembly 440. As illustrated in FIG. 4C, the barrier 442 provided on an upper surface of the printed circuit board 402 can be used as a seal between the inner, upper surface 461 of the portable electronic device housing 462 and the EMI shield can 408. More generally, the barrier 442 also seals downward against the surface of the printed circuit board 402, one or more electronic devices 404 attached to the printed circuit board 402, and/or the EMI shielding can 408. As shown, the EMI sealing can 408 encloses the electronic devices 404'. Other cross sectional views of the portable electronic device housing 460 can illustrate the barrier 442 sealing downward against the surface of (i) the printed circuit board 402, and/or (ii) the one or more electronic devices 404 attached to the printed circuit board 402.

In addition, a first seal 462 and a second seal 464 can combine to form a back volume 466 behind a back side of the speaker 410. The first seal 462 and the second seal 464 can create a seal between the back volume 466 of the speaker 410 and a front volume 468 of the speaker 410. The EMI shielding can 408 can include one or more openings (e.g., holes) in its upper surface adjacent the speaker 410. The openings enable sound waves induced by the speaker 410 to propagate into the EMI shielding can 408. The EMI shielding can 408 also includes at least one opening 470 that allows the sound waves from the speaker 410 to exit the EMI shielding can 408. The opening 470 is an opening of or into the front volume 468. The portable electronic device housing 460 also includes an opening 472. The opening 472 is coupled to the front volume 468 for the speaker 410 so that sound waves generated by the speaker 410 can exit the portable electronic device housing 460. The opening 472 can be a dedicated opening for the speaker 410 or can alternatively be an opening provided for another purpose (e.g., connector opening).

Figure 5A:
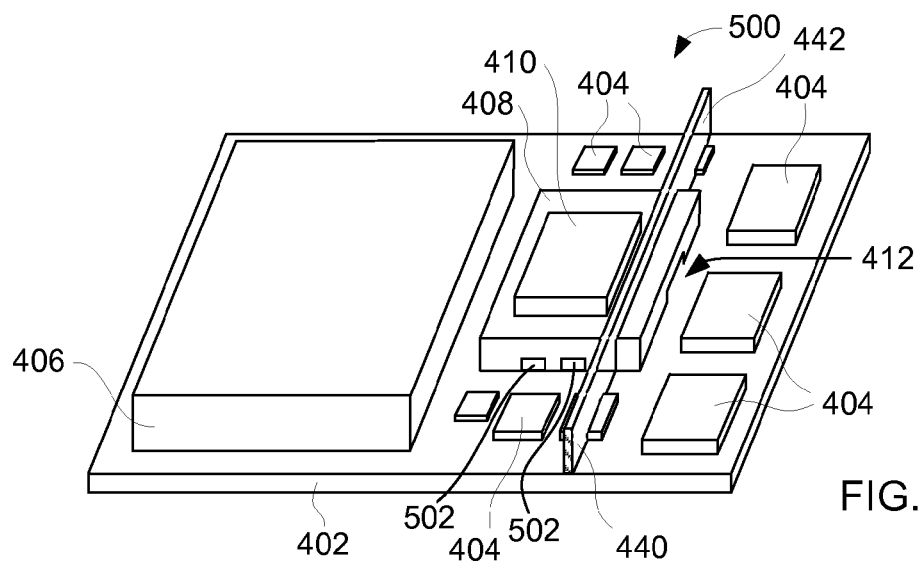
FIG. 5A is an upper perspective view of a board assembly according to still another embodiment of the invention.

FIG. 5A is an upper perspective view of a board assembly 500 according to still another embodiment of the invention. The board assembly 500 is generally similar to the board assembly 440 illustrated in FIG. 4B. However, the board assembly 500 further details that the EMI shielding can 408 can include other openings 502 besides the opening 412. With the barrier 442, the opening in the EMI shielding can 408 provide a path for sound waves from the speaker 410 to pass out of the EMI shielding can 408 to a remaining portion of a front volume. However, this implies that the volume within the EMI shielding can 408 is part of the front volume and thus needs to be isolated from the back volume. Accordingly, to the extent that the EMI shield can 408 includes additional openings 502 beyond the opening 412, the additional openings 502 need to be covered, filled or otherwise sealed to isolate the front volume inside the EMI shielding can 408 from the back volume outside the EMI shielding can 408.

Figure 5B:
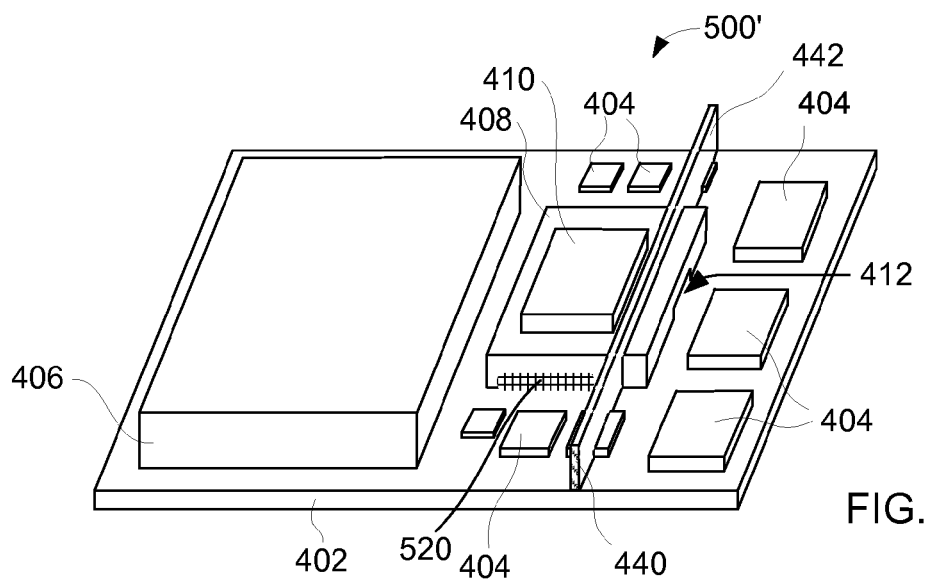
FIG. 5B is an upper perspective view of a board assembly according to still another embodiment of the invention.

FIG. 5B is an upper perspective view of a board assembly 500' according to still another embodiment of the invention. The board assembly 500' represents the board assembly 500 illustrated in FIG. 5A with the additional openings 502 filled by a form-in-place material 520. In one implementation, the form-in-place material can be applied in a liquid for so as to easily conform to irregular surfaces and then cure to form a solid seal. The resulting solid seal is typically compliant so as to facilitate sealing with pressure on the seal. The form-in-place material 520 can pertain to liquid silicone, unset epoxy, or foam.

In alternative embodiment, the openings 502 can be sealed by other materials. For example, the opening 502 can be cover, such as with an adhesive tape, or filled with a substance, such as silicone, metal or rubber.

Figure 6:
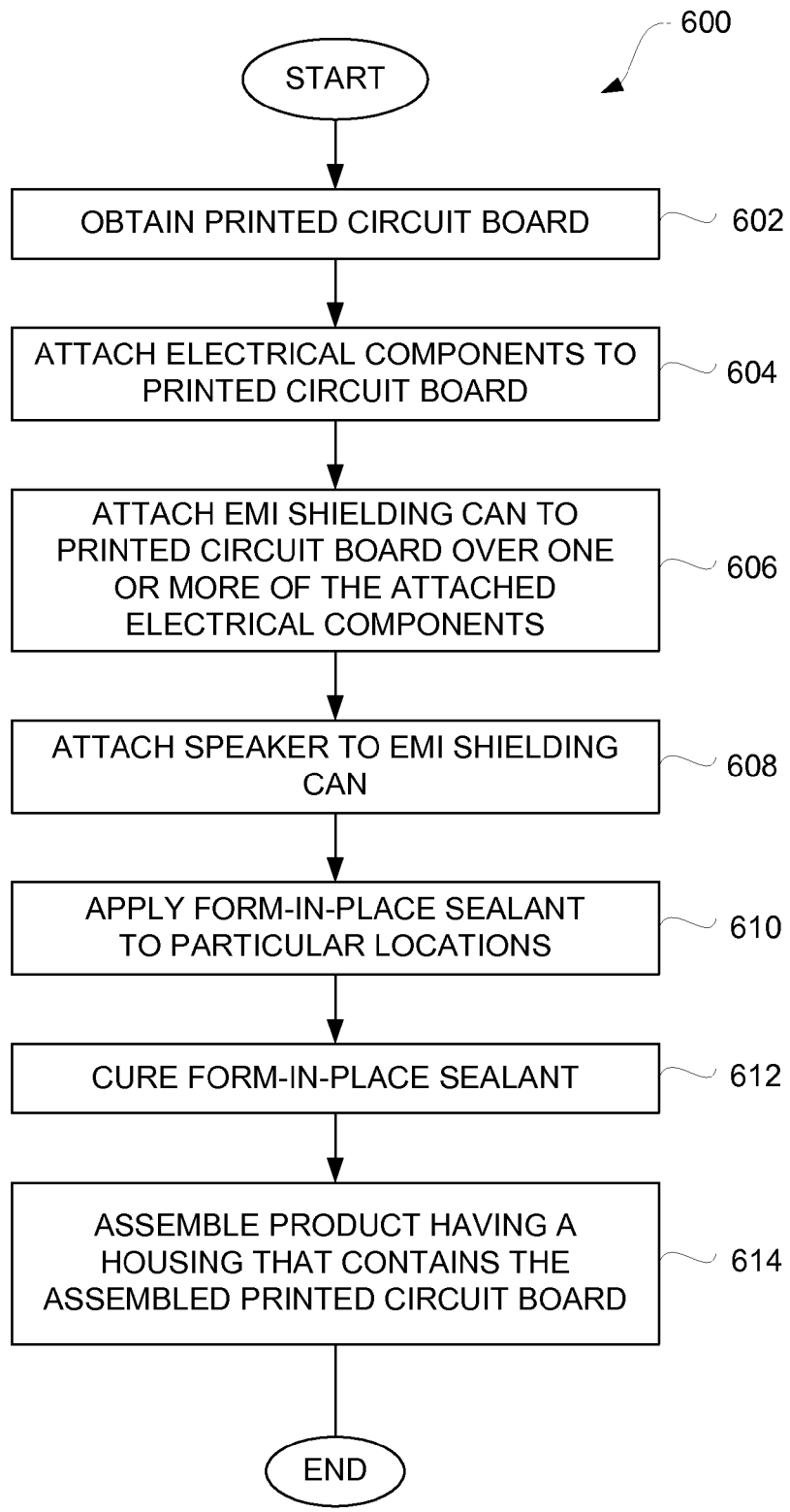
FIG. 6 is a flow diagram of an assembly process for a portable electronic device according to one embodiment of the invention.

FIG. 6 is a flow diagram of an assembly process 600 for a portable electronic device according to one embodiment of the invention. The assembly process 600 serves to assemble a housing for a portable electronic device.

The assembly process 600 can initially obtain 602 a printed circuit board. Electrical components can then be attached 604 to the printed circuit board. In addition, an Electro-Magnetic Interference (EMI) shielding can is then attached 606 to the printed circuit board. In doing so, the EMI shielding can typically covers one or more of the electrical components attached to the printed circuit board. Next, a speaker can be attached 608 to the EMI shielding can.

A form-in-place sealant can then be applied 612 to particular locations. For example, the form-in-place sealant can be applied to seal internal regions of the housing for the portable electronic device such that a back volume and a front volume for the speaker are distinctly formed. The form-in-place sealant can be applied over irregular surfaces, thereby allowing the demarcation between the back volume and the front volume to be flexibly established regardless of internal structure. For example, the form-in-place sealant can be provided over a plurality of electrical components formed on a printed circuit board (see, e.g., FIG. 5A). As another example, the form-in-place sealant can be provided to seal openings with respect to the EMI shielding can (see, e.g., FIG. 5B). In one implementation, the form-in-place sealant is applied as a liquid so that it is able to conform to irregular geometries. As an example, the form-in-place sealant can be extruded into place.

After the form-in-place sealant has been applied 610, the form-in-place sealant is cured 612. In one implementation, the form-in-place sealant is cured 612 through use of heat. In another implementation, the form-in-place sealant is cured 612 through use of ultraviolet radiation. In still another implementation, the form-in-place sealant can be cured 612 in an ambient environment.

Thereafter, the end product can be assembled 614. The end product, namely, a portable electronic device, has a housing that contains the assembled printed circuit board. In doing so, one more gaskets may be utilized to seal portions of the assembled printed circuit board to interior surfaces of the housing so that a back volume and a front volume can be distinctly formed within the interior of the housing for the portable electronic device. While gaskets can be utilized to certain seal certain areas, in other regions form-in-place material can be used to seal or assist in sealing. For example, to the extent that sealing is to be provided over an irregular surface, conventional rubber gaskets are not able to provide an adequate seal; hence, the form-in-place material can be applied to seal such regions, alone or combination with one or more gaskets.

Although the assembly process 600 discussed above is for processing a printed circuit board for a single housing at a time, it should be understood that the assembly process could also concurrently process an array or sheet of printed circuit boards. For example, the operations 602-612 can be perform on an array or sheet of printed circuit boards to produce assembled printed circuit boards, and then final assembly of the individual printed circuit boards can be performed at operation 614.

A portable electronic device as discussed herein may be a hand-held electronic device. The term hand-held generally means that the electronic device has a form factor that is small enough to be comfortably held in one hand. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels.

Additional information on use of piezoelectric speakers and EMI shielding cans within electronic device housings can be found in U.S. patent application Ser. No. 12/236,452, filed Sep. 23, 2008, entitled "ELECTROMAGNETIC INTERFERENCE SHIELDS WITH PIEZOS", now U.S. Pat. No. 8,126,170, which is herein incorporated herein by reference.

Also, as discussed above, a portable electronic device housing can include an opening (or aperture) so that sound waves generated by a speaker can exit the portable electronic device housing. When the opening is provided for another purpose (e.g., connector opening), it can be referred to as a dual-purpose aperture. Additional information on dual-purpose apertures can be found in U.S. patent application Ser. No. 12/016,584, filed Jan. 18, 2008, and entitled "DUAL-PURPOSE HARDWARE APERTURE".

The advantages of the invention are numerous. Different embodiments or implementations may, but need not, yield one or more of the following advantages. One advantage of certain embodiments of the invention is that speakers can be used with compact housings for portable electronic devices while using minimal space within the housings. Another advantage of certain embodiments of the invention is that improved acoustic chambers can be provided within portable electronic device housings using non-dedicated areas and improved sealing techniques. For example, according to one embodiment, an acoustic chamber can yield high quality sound without needing a dedicated area within a housing of a portable electronic device.

The various aspects, features, embodiments or implementations of the invention described above can be used alone or in various combinations.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for assembling a portable electronic device having an internal acoustic back volume, said method comprising:
    obtaining a printed circuit board;
    attaching electrical components to the printed circuit board;
    attaching an EMI shielding can to the printed circuit board such that the EMI shielding can is placed over one or more of the attached electrical components;
    attaching a speaker to the EMI shielding can;
    applying a form-in-place sealant to one or more particular locations of the assembled printed circuit board;
    curing the form-in-place sealant; and
    thereafter assembling the portable electronic device such that the assembled printed circuit board is provided within a housing of the portable electronic device and such that the internal acoustic back volume is formed within the portable electronic device housing and coupled to the speaker; wherein:
    the EMI shielding can attached to the printed circuit board includes one or more openings in at least one side of the EMI shielding can; and
    at least one of the one or more particular locations for the form-in-place sealant is at the one or more openings in the at least one side of the EMI shielding can.

2. A method as recited in claim 1, wherein the form-in-place sealant participates in forming the internal acoustic back volume.

3. A method as recited in claim 1, wherein said applying the form-in-place sealant to the one or more particular locations of the assembled printed circuit board comprises:
    extruding the form-in-place sealant onto the one or more particular locations.

4. A method as recited in claim 1,
    wherein the form-in-place sealant is applied as a liquid sealant, and
    wherein said curing the form-in-place sealant causes the liquid sealant to harden to a solid sealant.

5. A method as recited in claim 1, wherein said attaching of the speaker to the EMI shielding can comprises:
    adhering the speaker to a top surface of the EMI shielding can.

6. A method as recited in claim 5, wherein said adhering provides an adhesive around a perimeter of the speaker so as to secure and substantially seal the speaker to the top surface of the EMI shielding can.

7. A method as recited in claim 6, wherein said adhering uses an adhesive tape.

8. A method as recited in claim 6,
    wherein the top surface of the EMI shielding can includes at least one top opening, and
    wherein the speaker is secured and substantially sealed over the at least one top opening.

9. A method as recited in claim 1, wherein the speaker is a flat, piezoelectric speaker.

* * * * *